US007728421B2

(12) United States Patent  (10) Patent No.: US 7,728,421 B2
Tanoue  (45) Date of Patent: Jun. 1, 2010

(54) SEMICONDUCTOR DEVICE

(75) Inventor: Tetsuharu Tanoue, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 48 days.

(21) Appl. No.: 11/626,464

(22) Filed: Jan. 24, 2007

(65) Prior Publication Data

US 2007/0216002 A1   Sep. 20, 2007

(30) Foreign Application Priority Data

Mar. 3, 2006  (JP) ............... 2006-057341

(51) Int. Cl.
*H01L 23/498* (2006.01)
(52) U.S. Cl. ................... 257/692; 257/E23.07
(58) Field of Classification Search ................. 257/692
See application file for complete search history.

(56) References Cited

U.S. PATENT DOCUMENTS

| | | | | |
|---|---|---|---|---|
| 5,216,278 A | * | 6/1993 | Lin et al. ............... | 257/688 |
| 5,841,192 A | * | 11/1998 | Exposito ............... | 257/701 |
| 6,137,168 A | * | 10/2000 | Kirkman ............... | 257/691 |
| 6,476,331 B1 | * | 11/2002 | Kim et al. ............. | 174/261 |
| 6,734,545 B1 | * | 5/2004 | Yamamura ............ | 257/691 |
| 6,855,626 B2 | * | 2/2005 | Sato et al. ............. | 438/622 |
| 7,109,573 B2 | * | 9/2006 | Nurminen ............. | 257/675 |
| 2004/0207067 A1 | * | 10/2004 | Ma ....................... | 257/690 |
| 2004/0238939 A1 | * | 12/2004 | Wu ....................... | 257/691 |
| 2005/0263873 A1 | * | 12/2005 | Shoji .................... | 257/698 |

FOREIGN PATENT DOCUMENTS

JP        2002-368398    12/2002

* cited by examiner

*Primary Examiner*—Sue Purvis
*Assistant Examiner*—Benjamin P Sandvik
(74) *Attorney, Agent, or Firm*—Mattingly & Malur, P.C.

(57) ABSTRACT

Plural via portions formed on a package substrate of a BGA include a first through-hole portion extended in the plane direction by an extension wiring connected to a land portion and a second through-hole portion that is arranged on the land portion serving as pad-on-via, whereby high-density wiring and multi-function of the BGA can be realized by using the package substrate having a two-layer wiring structure. Accordingly, cost for the package substrate can be reduced, and hence, cost for the BGA can be reduced, compared to a multi-layer wiring structure having four or six wiring layers.

9 Claims, 14 Drawing Sheets

SEMICONDUCTOR DEVICE

CROSS-REFERENCE TO RELATED APPLICATION

The present application claims priority from Japanese patent application No. 2006-57341 filed on Mar. 3, 2006, the content of which is hereby incorporated by reference into this application.

BACKGROUND OF THE INVENTION

The present invention relates to a semiconductor device, and more particularly to a technique effectively applied to a semiconductor device having a wiring board.

There has been proposed a technique in which an opening portion is formed on a solder resist layer covering the outermost conductive layer, a plating post is formed by filling a plating in a space defined by the side walls of the opening portion of the solder resist layer and the surface of the conductive layer, and a soldering member is formed on the surface of the plating post (see, e.g., Japanese Unexamined Patent Publication No. 2002-368398 (FIG. 5)).

SUMMARY OF THE INVENTION

A BGA (Ball Grid Array) having a semiconductor chip mounted on a wiring board frequently employs a multi-layer wiring board in order to cope with a high-density wiring and multi-function of the BGA. A multi-layer wiring board having four wiring layers or a multi-layer wiring board having six wiring layers disclosed in the above-mentioned Japanese Unexamined Patent Publication No. 2002-368398 are known as the multi-layer wiring board.

However, the number of the wiring layers is great in the multi-layer wiring board having four wiring layers or six wiring layers, thereby entailing a problem of increased number of manufacturing processes and increased cost.

Further, the multi-layer wiring board having four or more wiring layers has a thickness about double that of the wiring board having a two-layer wiring structure, thereby entailing a problem that it is difficult to downsize (to reduce the thickness of) a semiconductor device.

The present inventors have examined the wiring board having the two-layer wiring structure that can cope with the high-density wiring and multi-function of the BGA, and as a result of the examination, the present inventors have found the following.

Plural bonding leads (wire bonding portions) are formed on the main surface of the wiring board, having the two-layer wiring structure, employed for the BGA, and plural land portions are formed on its back surface. The bonding leads on the main surface and the land portions on the back surface are electrically connected via through-holes (via portions) extended by extension wirings in the plane direction.

With the advanced multi-function of a semiconductor device, the number of electrodes of a semiconductor chip, the number of bonding leads, and the number of lands (the number of rows) increase.

In order to realize a miniaturization of a semiconductor device, while ensuring a multi-function of a semiconductor device, it is necessary to make the size of a wiring board close to the size of the semiconductor chip as much as possible. Therefore, the bonding leads formed on the main surface of the wiring board are arranged in the vicinity of end portions (outer peripheral portion, end side) of the wiring board as much as possible.

Since the bonding leads are arranged in the vicinity of the end portions of the wiring board, the extension wirings drawn in the plane direction of the wiring board for establishing the connection to the through-holes are arranged toward the inside (center) of the wiring board.

When each of the increased bonding leads and land portions is arranged in a single row, the wiring board becomes great, resulting in that it is difficult to downsize the semiconductor device. Therefore, if the plural bonding leads and plural land portions are arranged in many rows, the miniaturization of the wiring board is possible.

However, the wiring board coping with high-density wiring and multi-function of a BGA has a great number of land portions on its back surface. For example, in the wiring board having plural land portions arranged in five rows at the outer periphery of the back surface, when the through-holes $12b$ are extended toward the inside (center) by the extension wirings $12d$ for all the land portions $12a$, the through-holes $12b$ extended from the land portions $12a$ at the third row from the outer side are arranged over two or three bonding leads $12c$ on the main surface, as shown in a package substrate 12 in FIG. 14 that is a comparative example. Specifically, since the arrangement pitch of the bonding leads $12c$ (e.g., 50 μm) is much smaller than the diameter of each of the through-holes $12b$ (e.g., 150 μm), a problem arises in which the adjacent bonding leads are electrically short-circuited through the through-hole $12b$ because one through-hole $12b$ is arranged over plural bonding leads $12c$.

In order to prevent the problem of short-circuit described above, the arrangement pitch of the bonding leads $12c$ is increased. This configuration prevents the through-hole $12c$ from being arranged over plural bonding leads $12c$, but with this configuration, the size of the wiring board increases, and hence, it is difficult to downsize the semiconductor device.

In view of this, the present inventor has examined the configuration in which all through-holes $12b$ are arranged immediately above the land portions $12a$ (this configuration is hereinafter referred to as pad-on-via). As a result of the examination, the present inventor has found that the short-circuit problem is improved but a new problem described below occurs.

Firstly, as shown in FIG. 15, the bonding leads are arranged in many rows so as to cope with the high-density wiring and multi-function of a BGA, with the result that a multistage wire loop is formed. Therefore, the wires are likely to interfere with each other, whereby the wire bonding becomes difficult. Further, it is difficult to arrange the through-holes $12b$ immediately below the semiconductor chip 1 in the configuration of the pad-on-via in which the drawing is not performed by the extension wirings on the main surface of the package substrate 12. Therefore, plural land portions $12a$ can only be arranged at the outer periphery of the semiconductor chip 1, with the result that the size of the package substrate 12 increases, and hence, the miniaturization of the semiconductor device becomes difficult.

In the pad-on-via, the strength of the wiring portion of the through-holes $12b$ is lower than that of the bonding leads $12c$ (the bonding leads not having the through-holes formed immediately therebelow) to which the extension wirings are connected, so that the wiring of the through-holes $12b$ cannot withstand the bonding load (load by a capillary) upon the wire bonding, thereby producing cracks. Further, a conductive film is filled in the through-hole $12b$, and a concave portion is formed since the flatness at the region of the through-hole $12b$ is low, as shown in FIG. 16. Accordingly, when the wire bonding is performed on the pad-on-via, the bonding property between the wires 4 and the pad-on-via is relatively low.

Therefore, when stress is concentrated, poor wire bonding is likely to occur compared to the bonding lead portions.

An object of the present invention is to provide a technique capable of reducing cost for a semiconductor device.

Another object of the present invention is to provide a technique capable of downsizing a semiconductor device.

Still another object of the present invention is to provide a technique capable of providing a high-density wiring on a wiring board of a semiconductor device.

Still another object of the present invention is to provide a technique capable of enhancing reliability of mounting of a semiconductor device.

The foregoing and other objects, features, aspects and advantages of the present invention will become more apparent from the following detailed description of the present invention when taken in conjunction with the accompanying drawings.

A brief description will be given to the outline of the representative aspects of the present invention disclosed in the present application.

Specifically, the present invention is a semiconductor device wherein a wiring board of the semiconductor device has plural wire bonding portions on its main surface, plural land portions on its back surface, and plural via portions for electrically connecting the wire bonding portions and corresponding land portions, wherein the plural via portions include first via portions arranged as extended by extension wirings that are connected to the land portions, and second via portions arranged on the land portions.

A brief description will be given to the effects obtained by the representative aspects of the present invention disclosed in the present application.

The via portions of the wiring board include the first via portions arranged as extended by extension wirings that are connected to the land portions, and second via portions arranged on the land portions, whereby high-density wiring or multi-function of a semiconductor device can be realized by using a board having a two-layer wiring structure. As a result, cost for the board can be reduced, compared to the case of using a multi-layer wiring board, with the result that cost for a semiconductor device can be reduced.

DETAILED DESCRIPTION OF THE PREFERRED EMBODIMENTS

Figure 1:
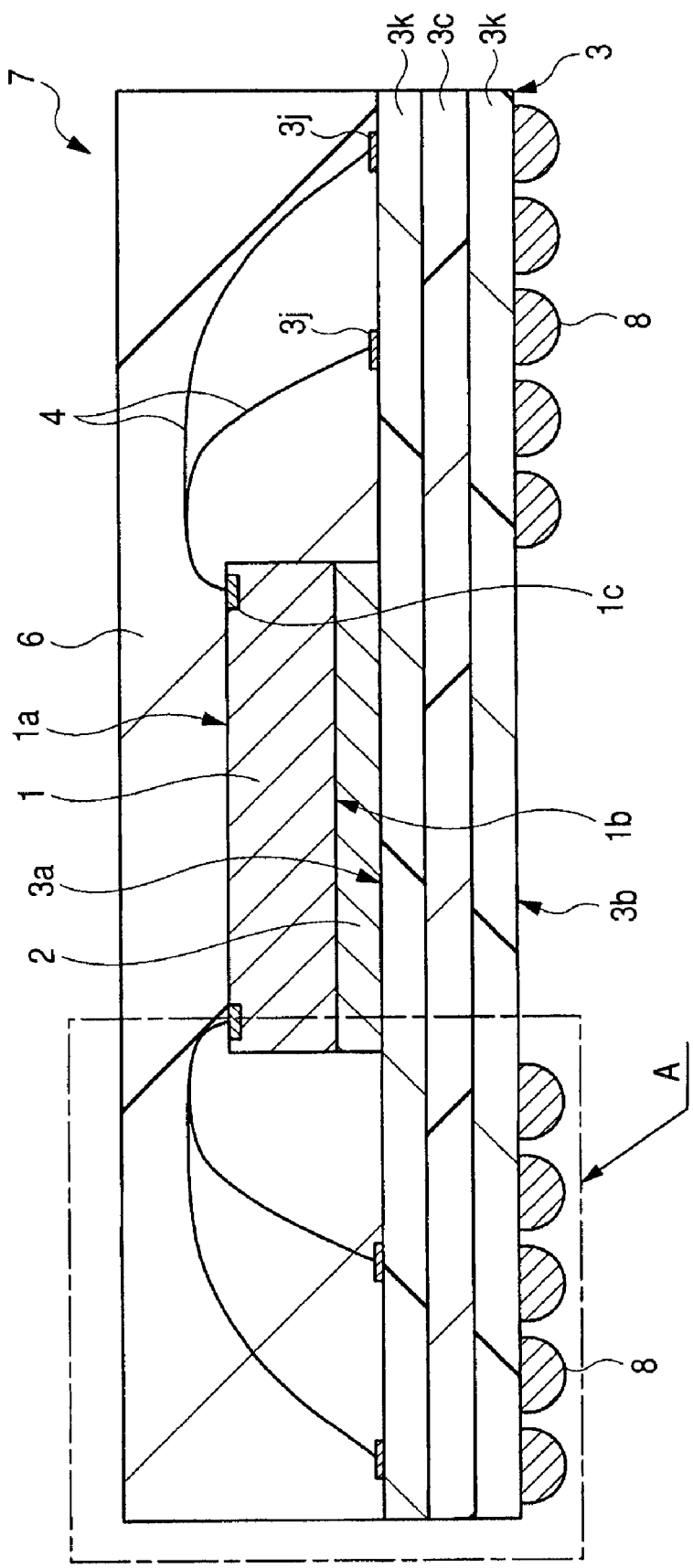
FIG. 1 is a sectional view showing one example of a structure of a semiconductor device according to an embodiment of the present invention.

In the following embodiments, explanations of the same or similar portions will not be repeated in principle except when particularly required.

In the following embodiments, descriptions will be made separately to plural sections or embodiments when required. Unless otherwise stated, they are not independent of each other, and one is dependent partially or wholly on others in terms of variants, details, additional descriptions, and the like.

In the embodiments below, the number of elements (including count, numeric value, quantity, and range), when designated, are not limited to the designated number and may be around the designated number, except in cases where it is explicitly specified and cases where it is theoretically limited to the specific number.

The present invention will be explained in detail with reference to drawings. In all drawings for explaining the embodiments, elements having identical functions are identified by the same reference numerals and duplicate descriptions of them are omitted.

EMBODIMENT

Figure 2:
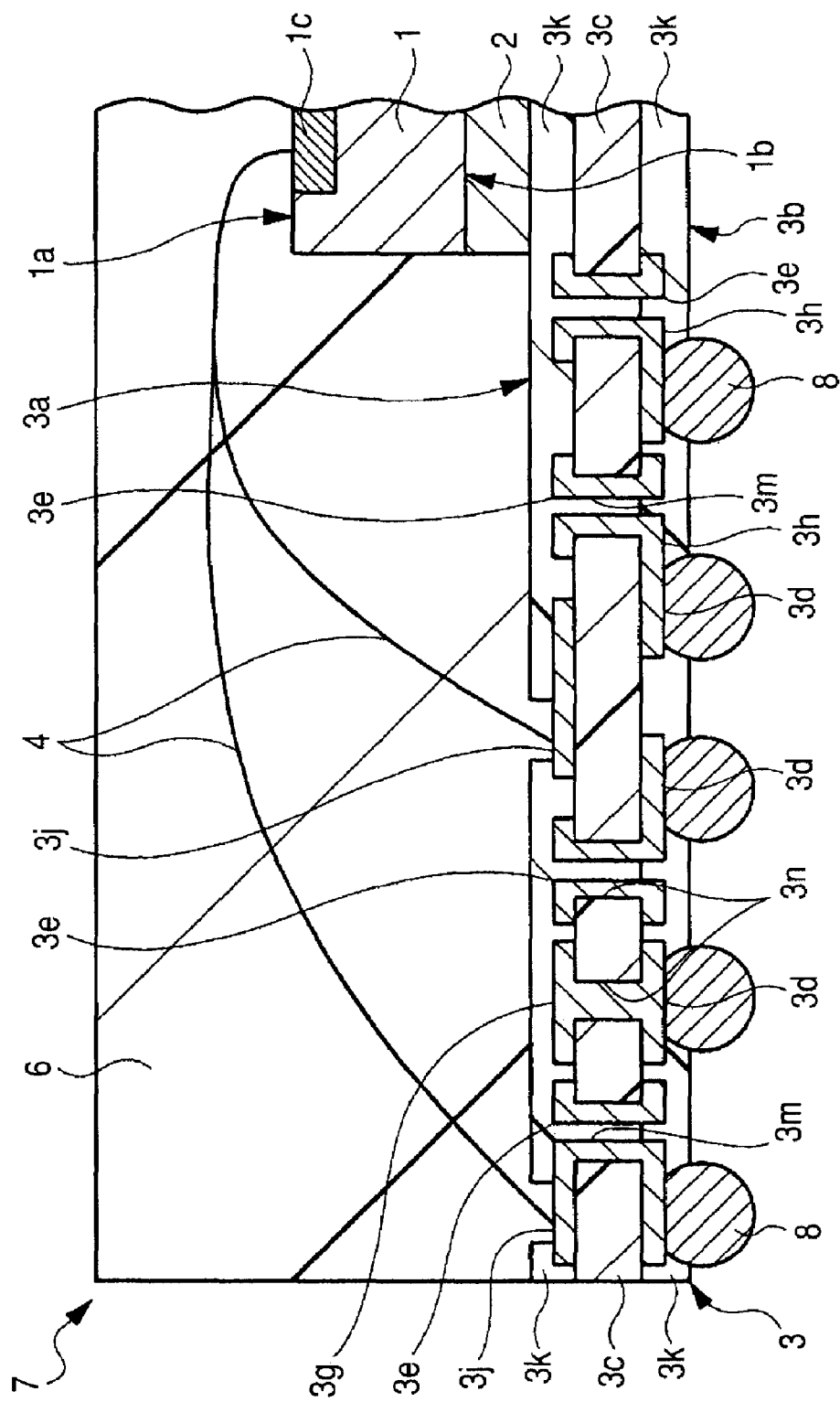
FIG. 2 is an enlarged partial sectional view showing the structure of A portion shown in FIG. 1.
Figure 3:
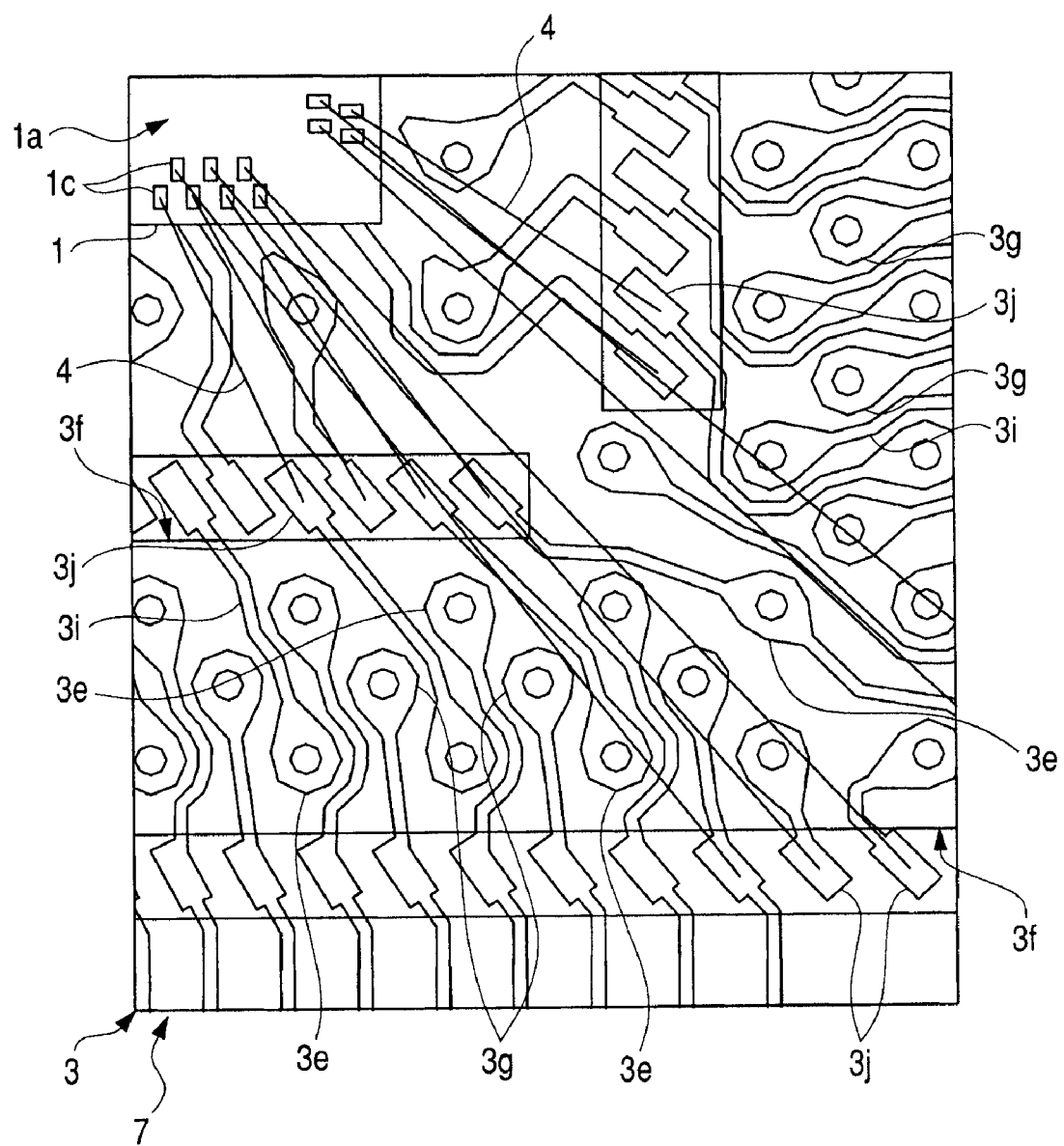
FIG. 3 is an enlarged partial plan view showing one example of the internal structure of the semiconductor device shown in FIG. 1 as seen through a resinous member.
Figure 4:
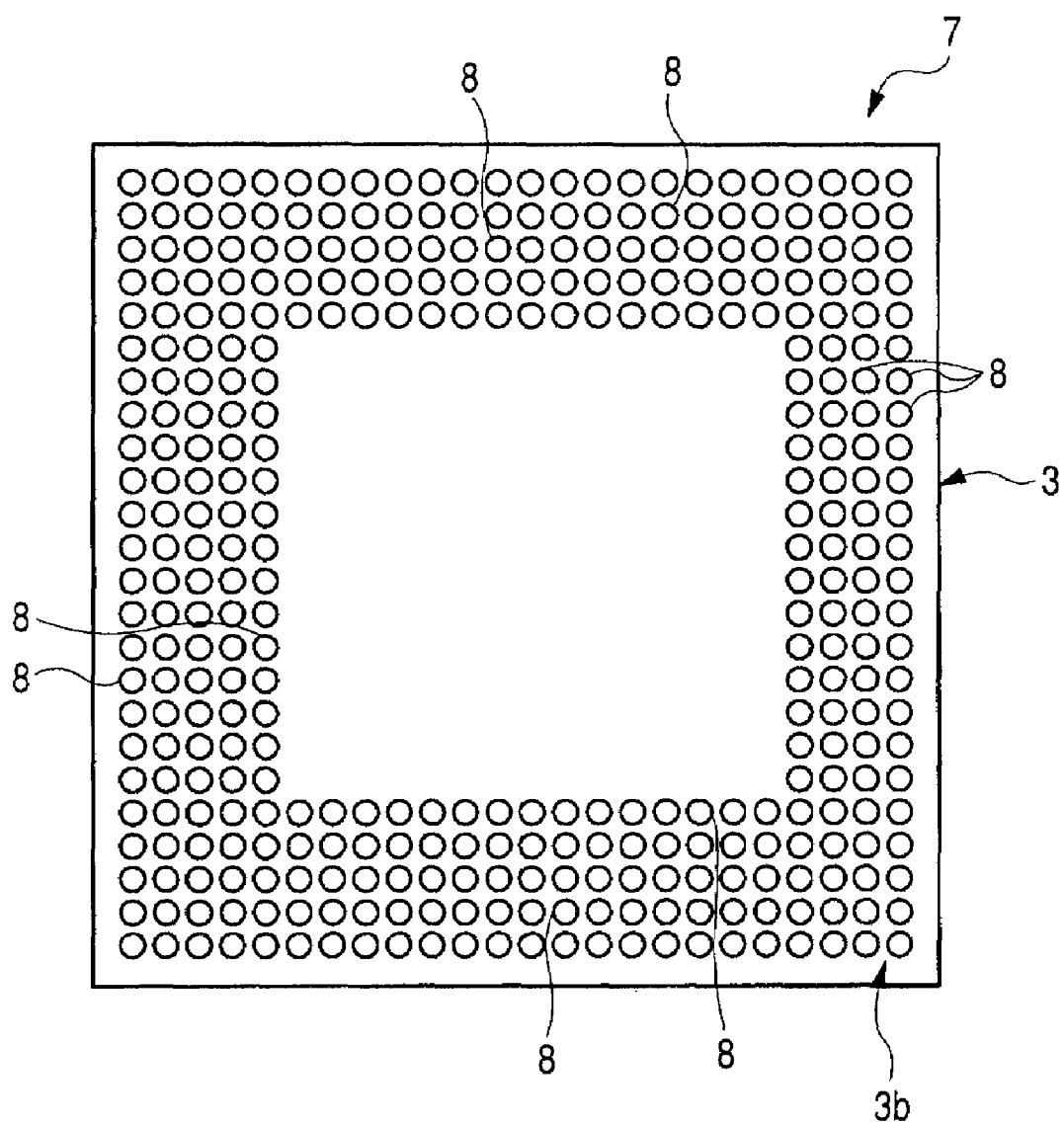
FIG. 4 is a backside view showing one example of the structure of the semiconductor device shown in FIG. 1.
Figure 5:
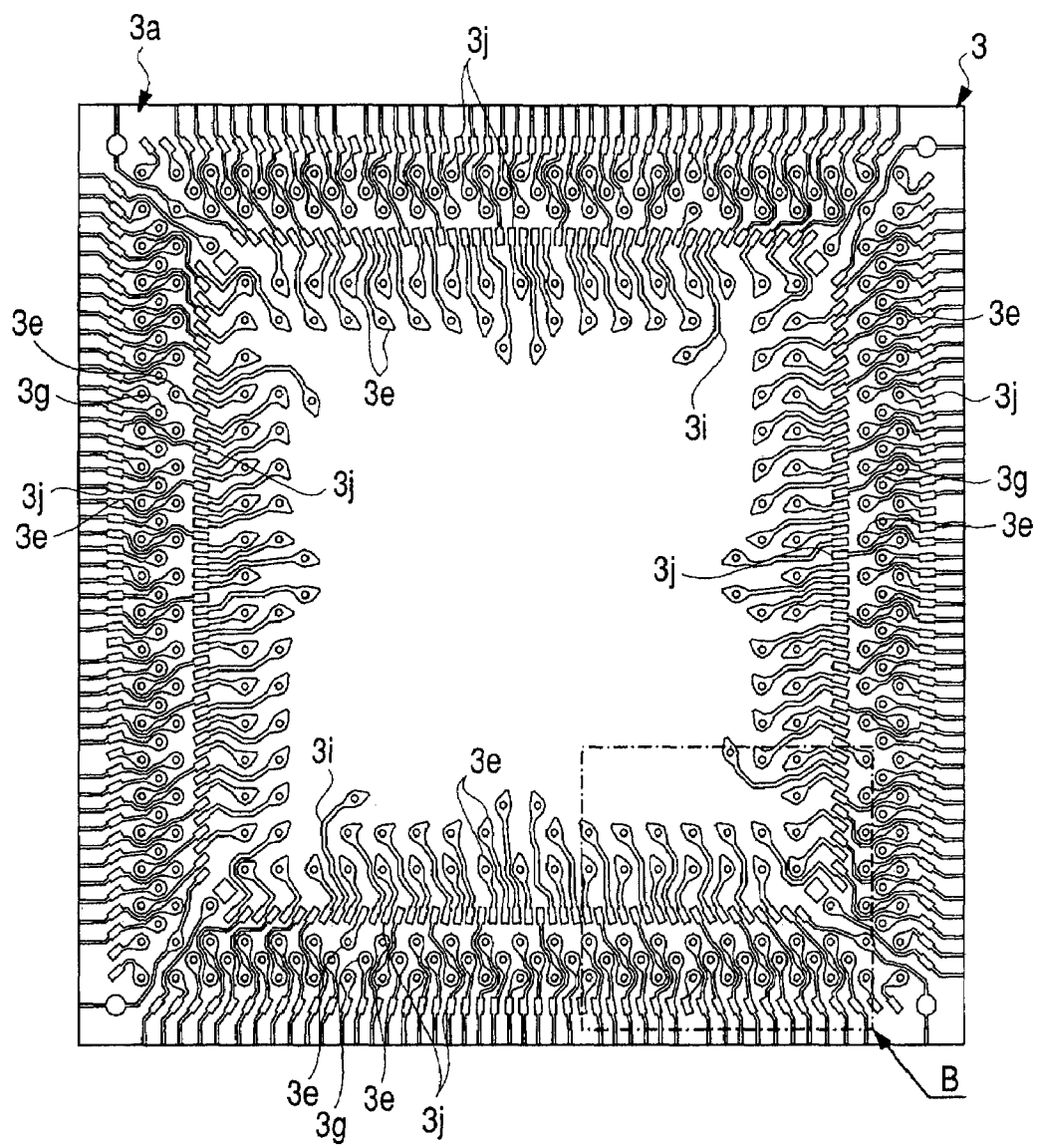
FIG. 5 is a plan view showing one example of a conductor pattern at the main surface of a wiring board incorporated in the semiconductor device shown in FIG. 1
Figure 6:
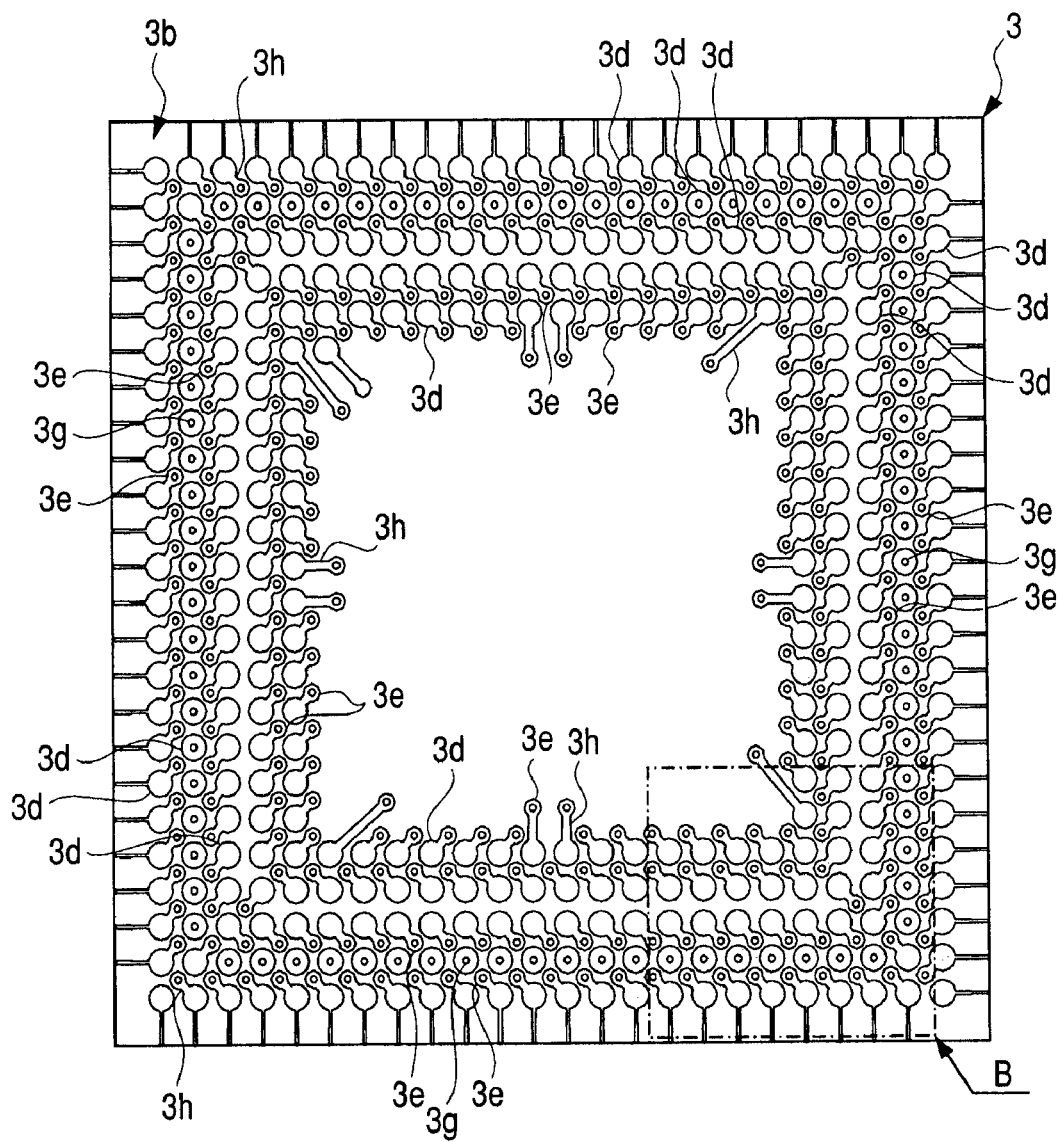
FIG. 6 is a backside view showing one example of a conductor pattern at the back surface of the wiring board shown in FIG. 5.
Figure 7:
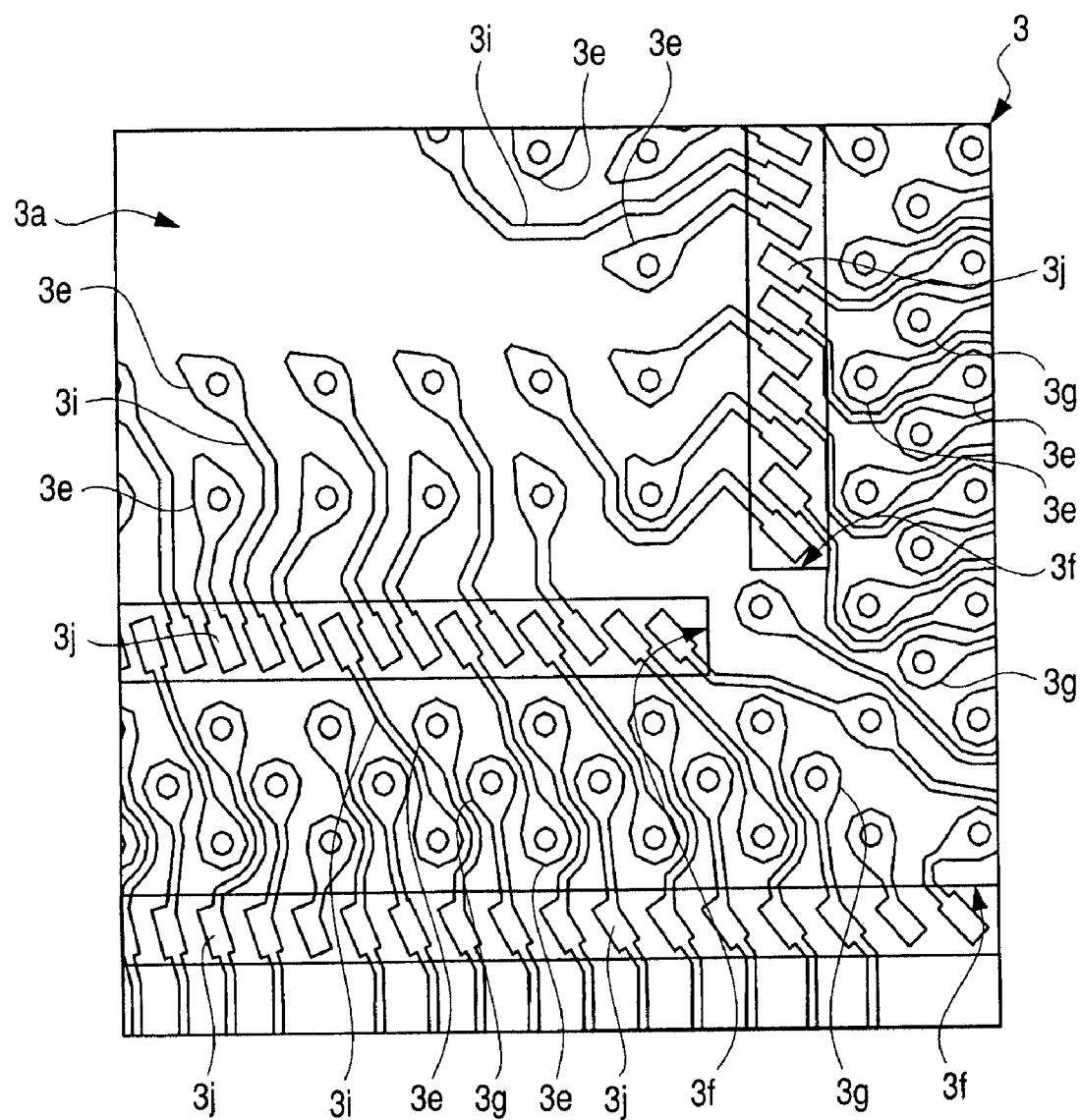
FIG. 7 is an enlarged partial plan view showing the structure of B portion shown in FIG. 5.
Figure 8:
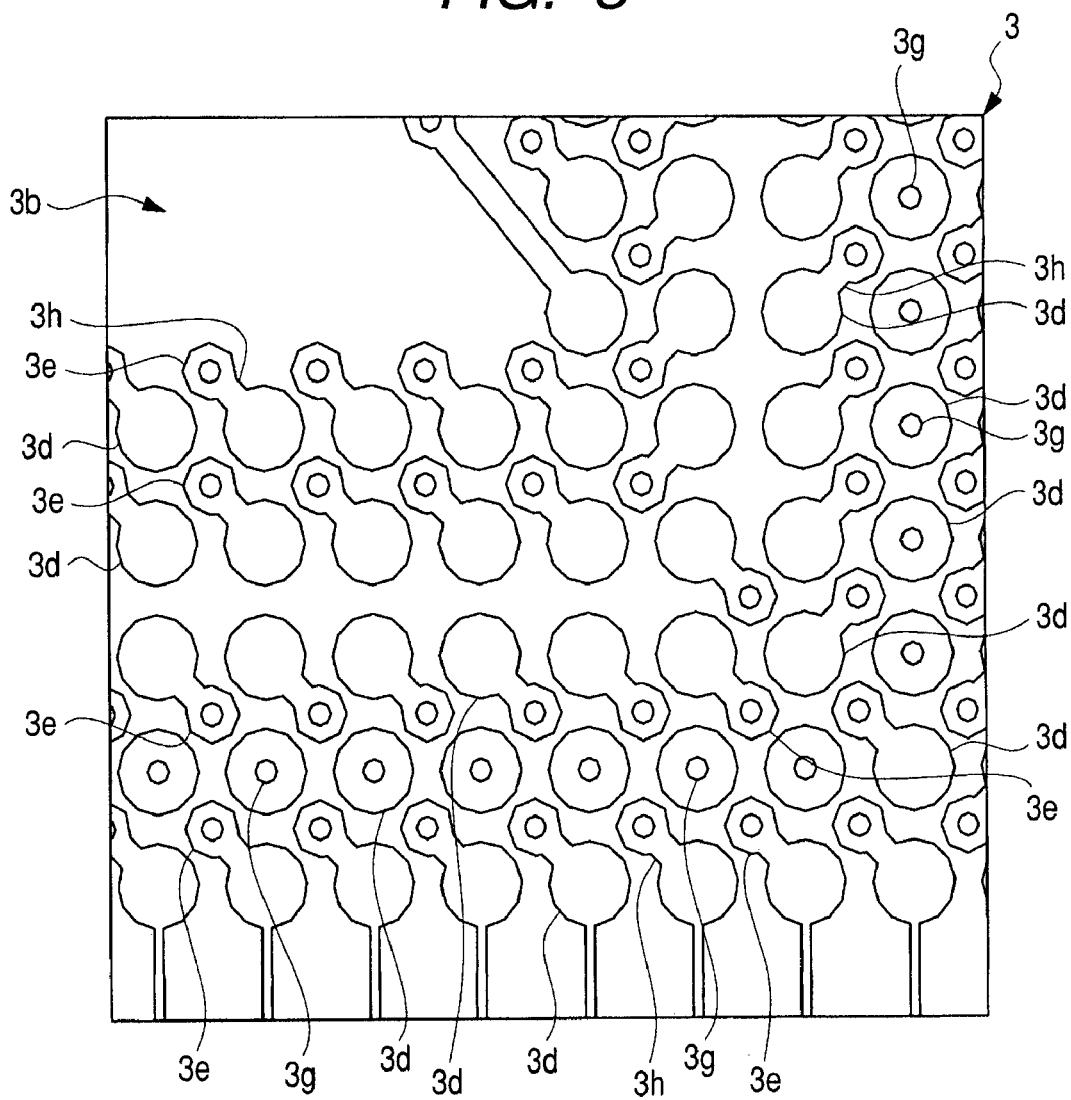
FIG. 8 is an enlarged partial backside view showing the structure of B portion shown in FIG. 6.
Figure 9:
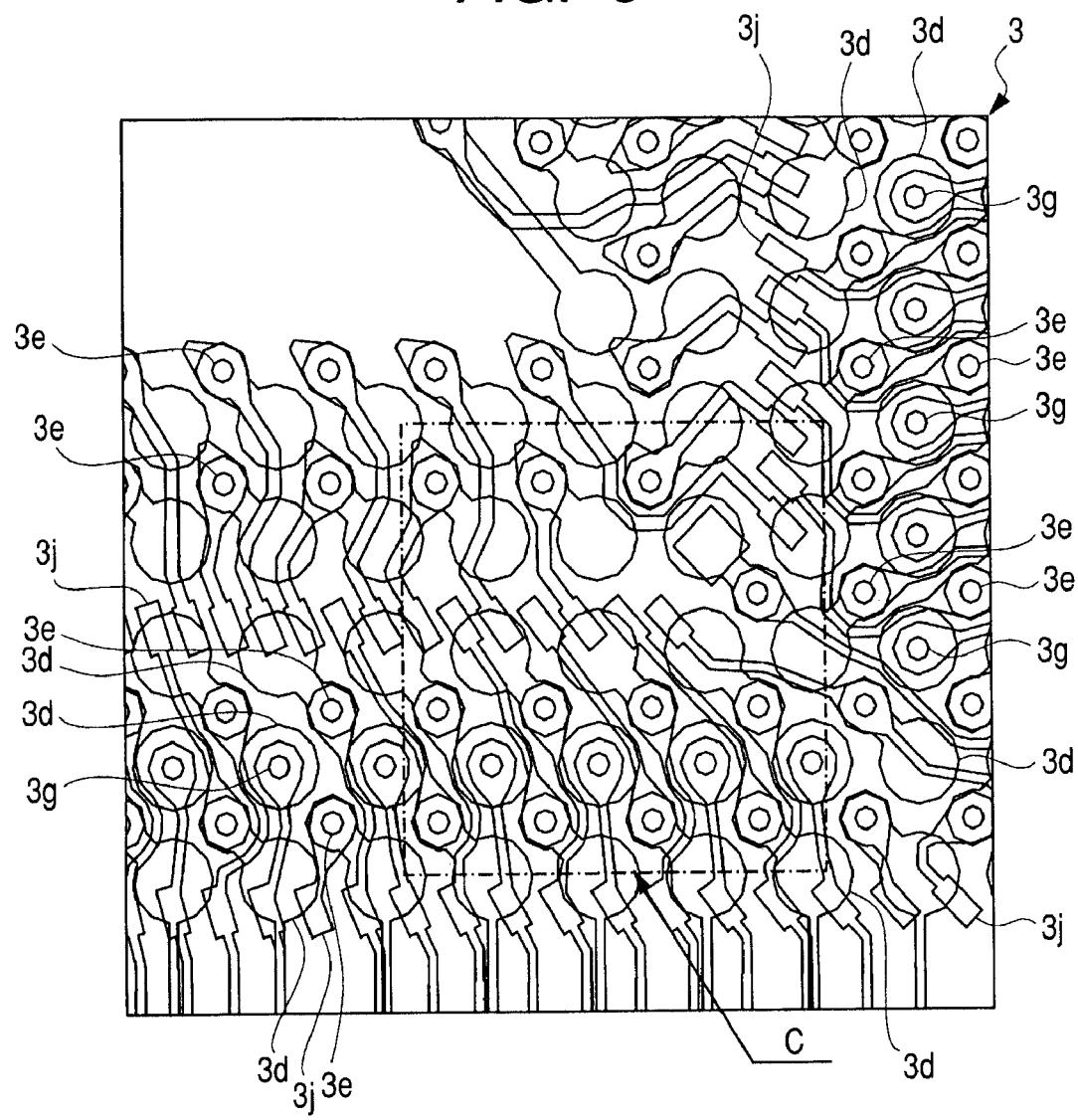
FIG. 9 is a view showing the conductor pattern wherein the conductor patterns at the main surface and at the back surface on the B portion shown in FIG. 5 are overlapped with each other.
Figure 10:
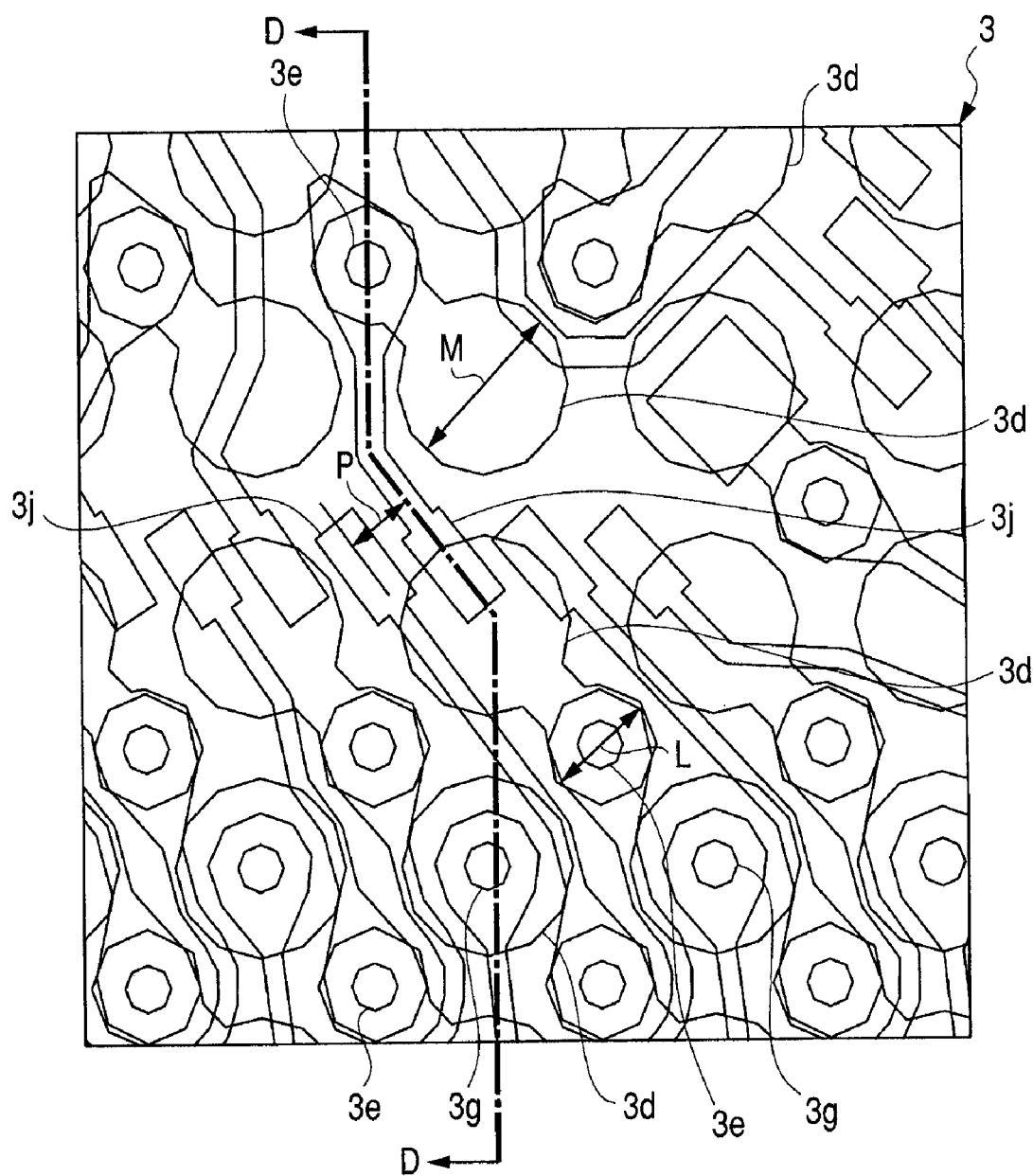
FIG. 10 is an enlarged partial plan view showing a structure of C portion shown in FIG. 9.
Figure 11:
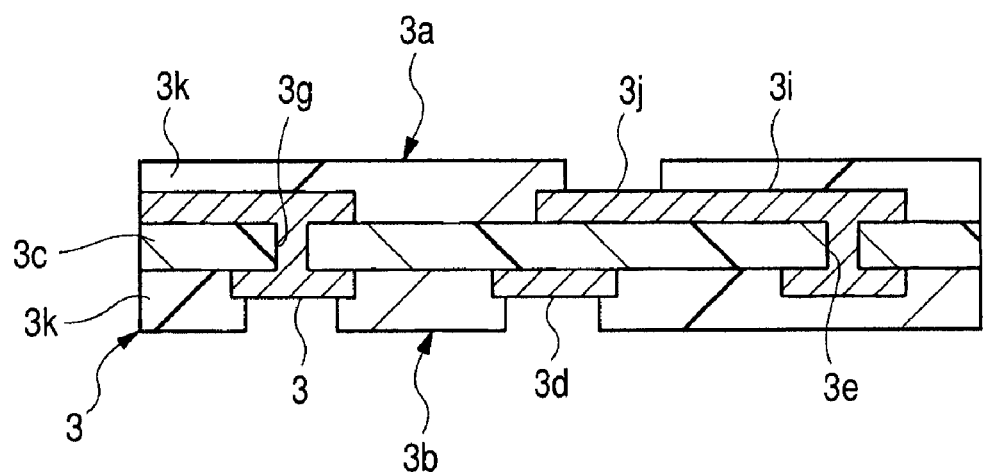
FIG. 11 is a partial sectional view showing the structure of the cross-section cut along a D-D line in FIG. 10.
Figure 12:
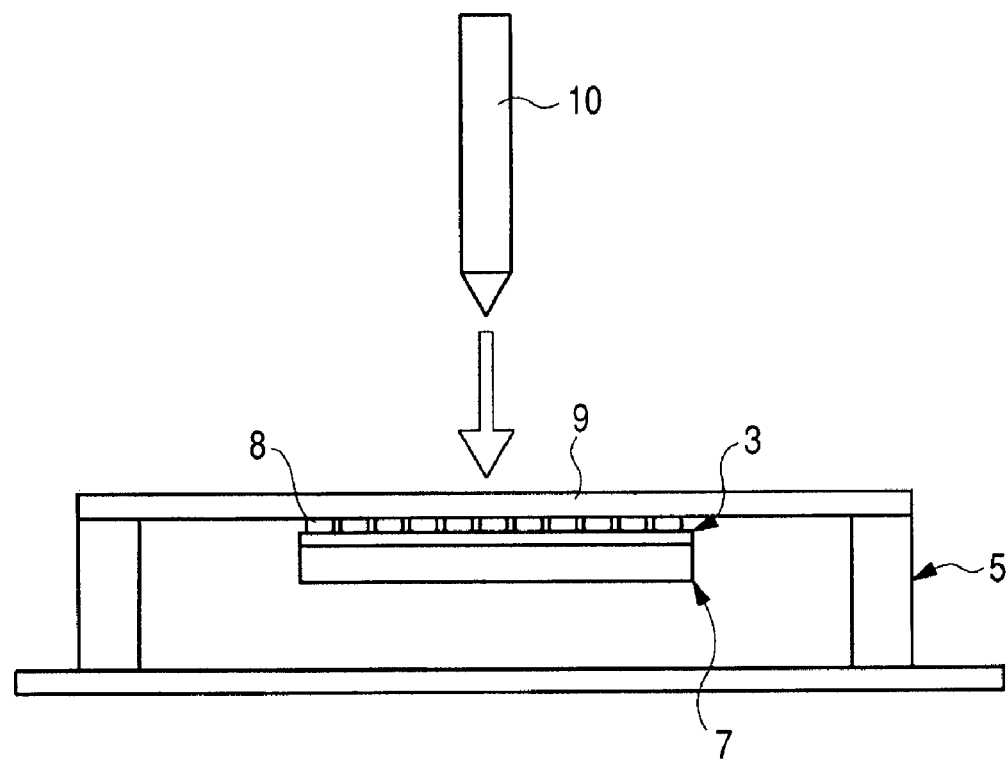
FIG. 12 is a conceptual view showing one example of a method of a shock test for the semiconductor device according to the present invention.
Figure 13:
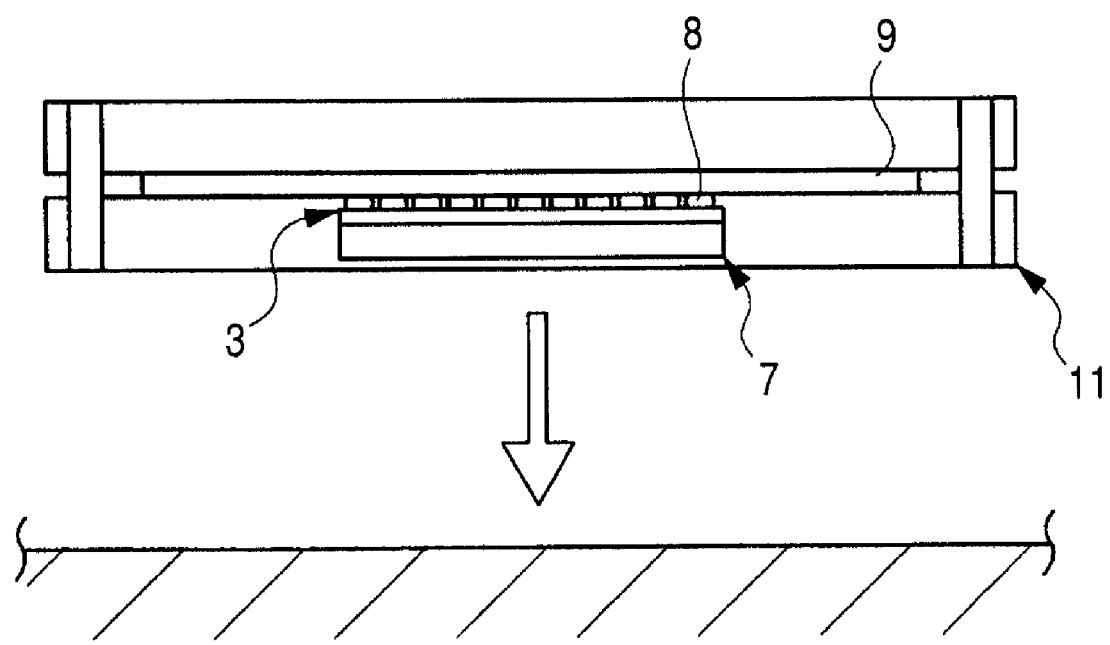
FIG. 13 is a conceptual view showing one example of a method of a drop test for the semiconductor device according to the present invention.
Figure 14:
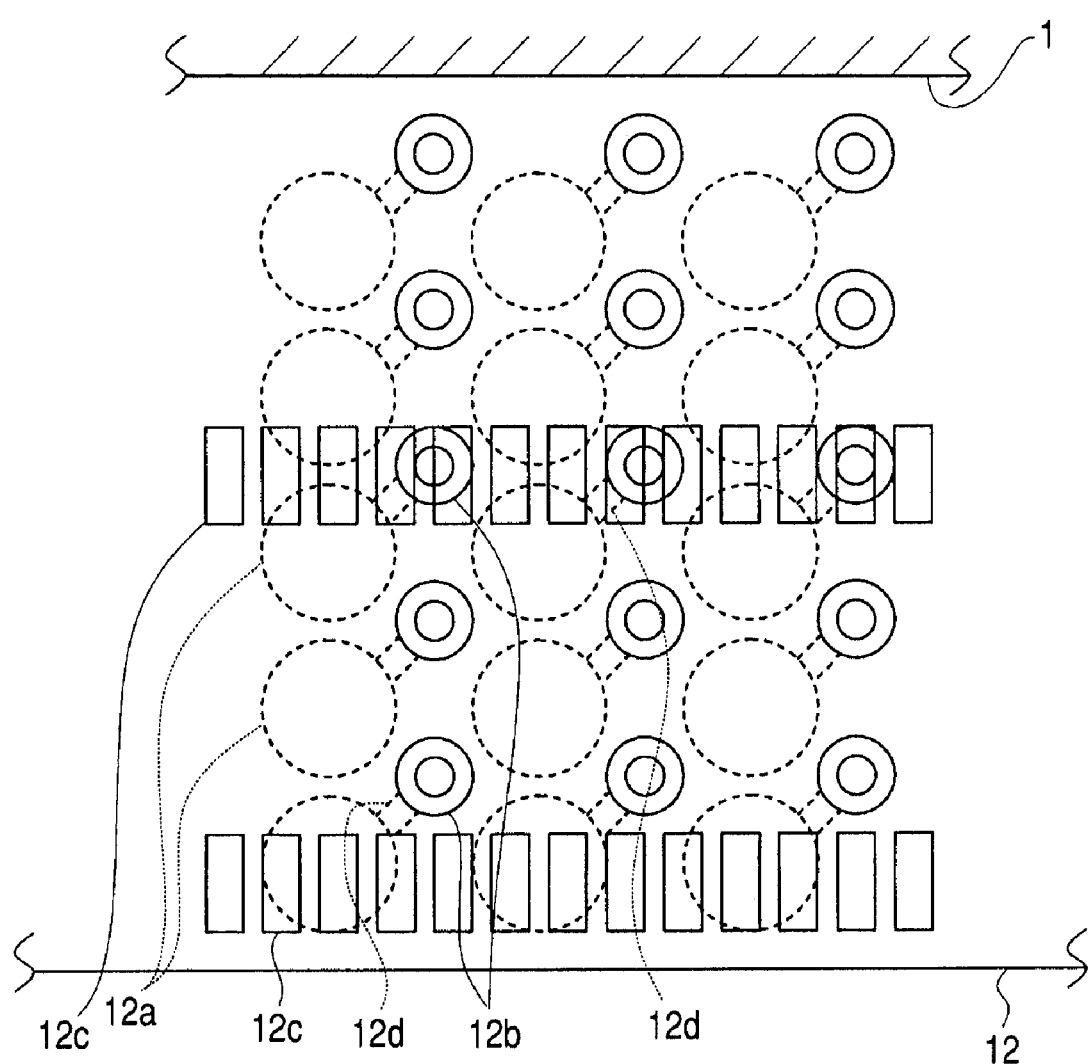
FIG. 14 is an enlarged partial plan view showing one example of a positional relationship between bonding leads and through-holes on a conductive pattern of a wiring board incorporated in a semiconductor device according to a comparative example.
Figure 15:
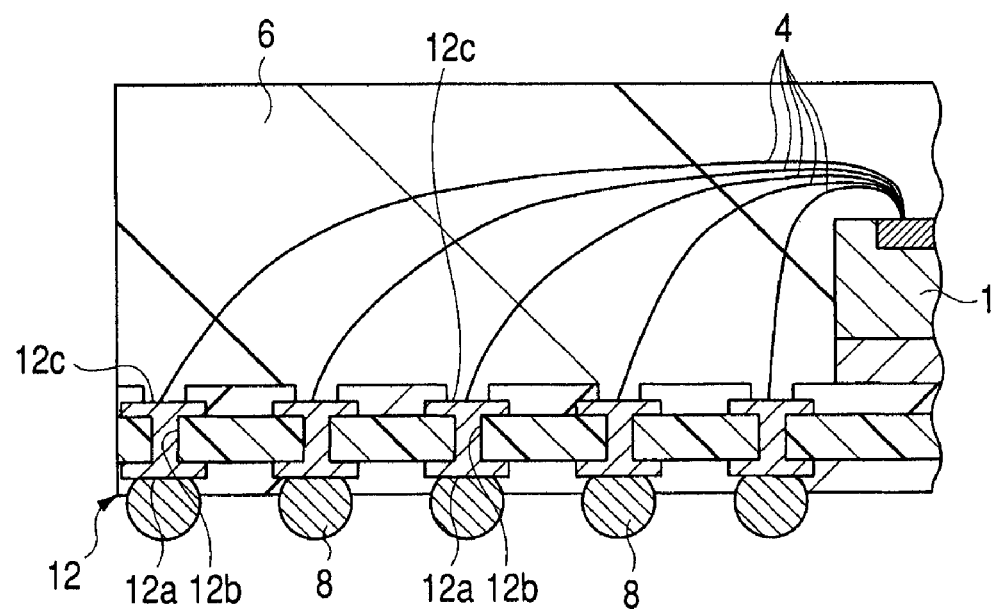
FIG. 15 is a partial cross-sectional view showing a structure of a semiconductor device according to a comparative example.
Figure 16:
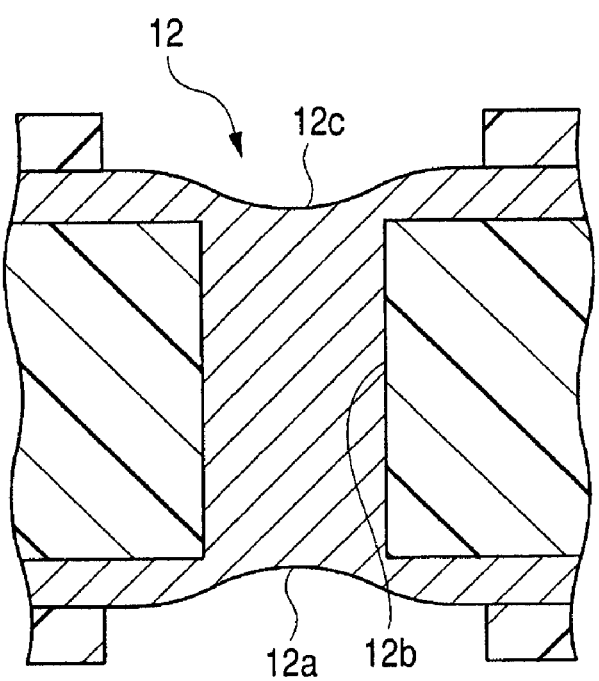
FIG. 16 is an enlarged partial sectional view showing a structure of a through-hole in FIG. 15.

FIG. 1 is a sectional view showing one example of a structure of a semiconductor device according to the embodiment of the present invention, FIG. 2 is an enlarged partial sectional view showing the structure of A portion shown in FIG. 1, FIG. 3 is an enlarged partial plan view showing one example of the internal structure of the semiconductor device shown in FIG. 1 as seen through a resinous member, and FIG. 4 is a backside view showing one example of the structure of the semiconductor device shown in FIG. 1. FIG. 5 is a plan view showing one example of a conductor pattern at the main surface of a wiring board incorporated in the semiconductor device shown in FIG. 1, FIG. 6 is a backside view showing one example of a conductor pattern at the back face of the wiring board shown in FIG. 5, FIG. 7 is an enlarged partial plan view showing the structure of B portion shown in FIG. 5, FIG. 8 is an enlarged partial backside view showing the structure of B portion shown in FIG. 6, and FIG. 9 is a view showing the conductor pattern wherein the conductor patterns at the main surface and at the back surface on the B portion shown in FIG. 5 are overlapped with each other. FIG. 10 is an enlarged partial plan view showing a structure of C portion shown in FIG. 9, FIG. 11 is a partial sectional view showing the structure of the cross-section cut along a D-D line in FIG. 10, FIG. 12 is a conceptual view showing one example of a method of a shock test for the semiconductor device according to the present invention, and FIG. 13 is a conceptual view showing one example of a drop test for the semiconductor device according to the present invention.

A semiconductor device according to the present embodiment is a resin-encapsulated semiconductor package having a semiconductor chip 1 mounted on a wiring board. A BGA 7 illustrated in FIGS. 1 to 4 is described in the present embodiment by way of example. The BGA 7 is a semiconductor package having relatively a great number of terminals, for example, 300 or more external terminals. As shown in FIG. 4, plural soldering balls, serving as the external terminals, are mounted to the back surface 3b of the wiring board as arranged in a grid.

The structure of the BGA 7 shown in FIGS. 1 to 4 will be explained. The BGA 7 has a package substrate (wiring board) 3, semiconductor chip 1 mounted on the main surface 3a of the package substrate 3, conductive wires 4 that electrically connect pads (electrode) 1c of the semiconductor chip 1 and bonding leads (wire bonding section) 3j on the main surface 3a of the package substrate 3, plural soldering balls (external terminals) 8 provided on land portions 3d at the back surface 3b of the package substrate 3, and resinous member 6.

The semiconductor chip is made of, for example, a silicon, and has an integrated circuit formed on its main surface 1a. A planar shape of the semiconductor chip 1 intersecting its thickness direction is quadrangular, e.g., square in this embodiment. Plural pads 1c that are electrically connected to the integrated circuit are formed at the peripheral edge portion of the main surface 1a as shown in FIG. 3. Each of the pads 1c and each of the bonding leads 3j formed on the main surface 3a of the package substrate 3 are electrically connected to each other via the conductive wire 4. The wire 4 is, for example, a gold wire.

As shown in FIG. 1, the semiconductor chip 1 is mounted to the package substrate 3 in such a manner that the back surface 1b thereof is fixed to the package substrate 3 through an adhesive such as a paste or die-attach film, and the main surface 1a thereof faces upward.

The resinous member 6 is made of, for example, epoxy-based resin. The resinous member 6 is formed at the side of the main surface 3a of the package substrate 3 for resin-encapsulating the semiconductor chip 1 and plural conductive wires 4.

The plural soldering balls, serving as external terminals, formed at the back surface 3b of the package substrate 3 are made of, for example, a solder such as Pb—Sn. As shown in FIG. 4, they are provided on the back surface 3b of the package substrate 3 in a grid in five rows.

The package substrate 3 has, as shown in FIGS. 1 and 2, the main surface 3a, the back surface 3b opposite to the main surface 3a, core material 3c, plural conductive patterns formed on the main surface 3a, plural conductive patterns formed on the back surface 3b, and solder resist film 3k that is an insulating film for covering the conductive patterns except for a part thereof.

Specifically, the package substrate 3 in the present embodiment has a two-layer wiring structure in which the conductive patterns are formed on its main surface 3a and the back surface 3b. The solder resist film 3k is formed respectively on the main surface 3a and the back surface 3b. On the main surface 3a, plural bonding lead portions (wire bonding portions) 3j are exposed to the opening portion 3f (see FIG. 7) of the solder resist film 3k. On the other hand, each of the land portions 3d is exposed from the solder resist film 3k on the back surface 3b.

As shown in FIG. 5, plural bonding leads 3j and plural via portions (through-holes) connected to the corresponding bonding leads 3j through wiring portions 3i are formed on the main surface 3a of the package substrate 3. The plural bonding leads 3j are arranged in two rows at the peripheral edge and at its inner side of the main surface 3a.

On the other hand, formed on the back surface 3b of the package substrate 3 are, as shown in FIG. 6, plural land portions 3d, extension wirings 3h connected to some of the land portions 3d of the plural land portions 3d, and plural via portions (through-holes) connected to the extension wirings 3h. The plural land portions 3d are formed in five rows along the outer peripheral portion of the back surface 3b.

Therefore, the plural bonding leads 3j formed on the main surface 3a are electrically connected to the land portions 3d on the back surface 3b through the corresponding via portions (through-holes). The conductive patterns such as the bonding leads 3j, wiring portions 3i, and via portions (through-holes) on the main surface 3a and the land portions 3d, wiring portions 3i and via portions (through-holes) on the back surface 3b are made of, for example, a copper alloy, and electroless plating is performed to the conductive patterns. Since feeder lines are not required in this case, this structure is more effective for a high-density wiring. It is to be noted that the electrolytic plating may be performed after the feeder lines are provided to the conductive patterns.

A planar shape of the package substrate 3 intersecting its thickness direction is quadrangular, e.g., square in this embodiment.

The plural via portions formed at the package substrate 3 of the present embodiment include first through-hole portions (first via portions) 3e that are extended in the plane direction by the extension wirings 3h connected to the land portions 3d and second through-hole portions (second via portions) 3g arranged on the land portions 3d (the position overlapping with the land portions 3d in a plane) and referred to as a so-called pad-on-via. Specifically, plural first through-hole portions 3e arranged as extended from the land portions 3d in the plane direction and plural second through-hole portions 3g that are pad-on-vias are mounted to the package substrate 3 as intermixed.

Each of the via portions such as the first through-hole portions 3e and the second through-hole portions 3g is composed of a through-hole 3n formed on the core material 3c, and a conductive film (conductive section) 3m arranged inside the through-hole 3n. Specifically, the conductive film 3m is formed at the inner wall of the through-hole 3n, and this conductive film 3m is connected to the conductive pattern on the main surface 3a and the conductive pattern on the back surface 3b. It is to be noted that only the conductive film 3m may be filled in the through-hole 3n or the conductive film 3m and an insulating film may be formed.

The pad-on-via (second through-hole portion 3g) does not need the extension wirings 3h, since the pad-on-via is directly arranged on the land portion 3d. Therefore, the pad-on-via can be arranged in the narrow limited area. Specifically, the pad-on-via is more effective in that it is formed in a region having relatively high wiring density.

However, compared to the first through-hole portion 3e extended by the extension wiring 3h, the conductive portion arranged in the pad-on-via is low. Therefore, a crack is likely to be produced on the conductive film 3m due to the bonding load (load by a capillary) applied upon the wire bonding, compared to the bonding lead 3j connected to the via portion that is separated in a plane through the extension wiring 3h. Accordingly, the arrangement of the pad-on-vias at the region in the substrate where stress is likely to concentrate is preferably avoided. Specifically, the pad-on-vias are preferably arranged in the region where stress is difficult to be concentrated.

Specifically, when the first through-hole portions 3e extended by the extension wirings 3h and the second through-hole portions 3g that are pad-on-vias are mixedly formed in the package substrate 3, the arrangement of the pad-on-vias should be considered.

FIG. 12 shows one example of a method of a shock test carried out with the BGA 7 mounted to a test substrate 9, and FIG. 13 shows one example of a method of a drop test carried out with the BGA 7 mounted to the test substrate 9.

First, the shock test in FIG. 12 is carried out in such a manner that the BGA 7 is mounted to the test substrate 9 that is fixed to a first jig 5, which is a jig used for a shock test, and with this state, momentary shock is applied to the mounted BGA 7 by falling a rod 10, which is an iron rod, to the center of the BGA 7.

The drop test in FIG. 13 is carried out in such a manner that the BGA 7 is mounted to the test substrate 9 that is fixed to a second jig 11, which is a jig used for a drop test, and with this state, the BGA 7 is freely dropped together with the jig to apply stress to the mounted BGA 7.

From the results from the shock test in FIG. 12 and the drop test in FIG. 13, it is found that cracks are mainly produced at the bonding portion of the soldering ball 8 arranged at the outermost periphery among the plural soldering balls 8 formed on the back surface 3b of the package substrate 3 of the BGA 7. This is because, in the package substrate 3, the stress is easy to be concentrated at the position remote from the center of the package substrate 3. Specifically, stress is concentrated on the soldering balls 8 arranged at the outermost periphery of the package substrate 3, whereby the cracks are produced as a result of the shock test in FIG. 12 and the drop test in FIG. 13.

Therefore, since the conductive film 3m arranged inside the second through-hole portions 3g, which are pad-on-vias, has a strength lower than that of the first through-hole portions 3e extended by the extension wirings 3h, it is preferable that the second through-hole portions 3g are not arranged at the land portions 3d at the outermost periphery. Specifically, the land portions 3d arranged at the outermost periphery, among the plural land portions 3d, are preferably connected to the first through-hole portions 3e via the extension wirings 3h.

Further, as shown in FIG. 3, it is preferable that the first through-hole portions 3e having high strength are arranged on the extension line of the diagonal line of the semiconductor chip 1 at the package substrate 3. Specifically, since stress is easy to be concentrated on the corner portions including the diagonal line of the package substrate 3, the first through-hole portions 3e in which the conductive film 3m inside has relatively high strength are arranged, and the pad-on-vias (second through-hole portions) are not arranged at the corner portions.

As shown in FIG. 2, the bonding leads (wire bonding portions) 3j formed on the main surface 3a of the package substrate 3 are preferably connected to the via portions (first through-holes 3e, second through-holes 3g) formed at the position apart from the bonding leads in a plane via the extension wirings 3h. The reason is as follows. Specifically, when the via portions are formed immediately below the bonding leads 3j so as to be drawn to the back surface 3b of the package substrate 3, a single via portion is arranged over the plural bonding leads 3j, since the diameter of the via is greater than the arrangement pitch of the bonding leads 3i as described above. Therefore, the adjacent bonding leads are electrically short-circuited through the via portion. In order to prevent the short-circuit, the arrangement pitch of the bonding leads 3j has to be greater than the diameter of the via portion, which makes it difficult to downsize the package substrate 3. Accordingly, it is preferable that the pad-on-vias (second through-hole portions 3g) are not arranged at the bonding leads 3j and the via portions (first through-holes 3e, second through-holes 3g) formed at the position apart from the bonding leads in a plane through the extension wirings 3h are connected to the bonding leads 3j.

In the BGA 7 according to the present embodiment, plural bonding leads 3j are arranged in two rows at the peripheral edge portion and its inside on the main surface 3a of the package substrate 3 as shown in FIG. 5. On the other hand, plural land portions 3d are formed in five rows along the outer periphery of the back surface 3b as shown in FIG. 6.

Specifically, as shown in FIG. 7, plural bonding leads (first bonding leads) 3j are arranged at the outermost periphery of the main surface 3a, the via portions such as the first through-hole portions 3e and the second through-hole portions 3g are arranged in three rows at the inner side of the bonding leads 3j, and plural bonding leads (second bonding leads) 3j are arranged at the inner side of the via portions. Since the pad-on-vias (second through-hole portions 3g) are preferably not arranged immediately below the bonding leads 3j and at the outermost periphery of the back surface 3b, the land portions 3d connected to the first through-hole portions 3e through the extension wirings 3h are arranged at the outermost periphery of the back surface 3b as shown in FIG. 8.

Further, the inner bonding leads 3j are arranged at the side of the main surface 3a of the package substrate 3 at the position corresponding to the position between the land portions 3d on the third row and the land portions 3d on the fourth row from the outer side. Since it is preferable that the pad-on-vias (second through-hole portions 3g) are not arranged immediately below the bonding leads 3j, the land portions 3d connected to the first through-hole portions 3e through the extension wirings 3h are also arranged immediately below the inner bonding leads 3j on the main surface 3a as shown in FIG. 8. The land portions 3d on this row are the land portions 3d on the third row from the outer side.

Accordingly, on the back surface 3b of the package substrate 3, plural pad-on-vias (second through-hole portions 3g) are arranged on the land portions 3d on the second row from the outer side, among the land portions 3d of five rows, so as to correspond to the region between the bonding leads 3j at the outermost periphery of the main surface 3a and the inner bonding leads 3j.

In this case, on the back surface 3b shown in FIG. 8, the extension wirings 3h connected to the land portions 3d at the outermost periphery are extended inwardly, and the first through-hole portions 3e are connected to their end portions, while the extension wirings 3h connected to the land portions on the third row from the outer side are extended outwardly, and the first through-hole portions 3e are connected to their end portions.

Therefore, the pad-on-vias (second through-hole portions 3g) arranged on the land portions 3d on the second row from the outer side are arranged so as to be sandwiched between the first through-hole portions 3e in the direction from the outside to the inside.

Specifically, the land portions 3d on the second row from the outer side and the first through-hole portions 3e there-around are arranged at the region between the land portions 3d at the outermost periphery and the land portions 3d on the third row from the outer side, whereby this region forms an extremely high-density wiring. Therefore, arranging the second through-hole portions 3g, which are pad-on-vias, that do not need the extension wirings 3h is greatly effective in view of the reduced wiring space.

FIGS. 9 and 10 are views in which the conductive patterns on the main surface 3a and on the back surface 3b are overlapped with each other, and FIG. 11 shows its cross-sectional structure. As shown in FIG. 10, supposing that the arrangement pitch between the adjacent bonding leads 3j is P, the diameter of the via portion such as the first through-hole portion 3e is L, and the diameter of the land portion 3d is M, P is about 50 μm, L is about 150 μm, and M is about 200 to 300 μm, by way of example.

Accordingly, the relationship of P<L<M is established. In this case, the first through-hole portions 3e connected to the land portions 3d immediately below the bonding leads 3j at the outermost periphery and immediately below the inner bonding leads 3j (the land portions 3d at the outermost periphery and on the third row from the outer side) are extended through the extension wirings 3h, whereby the short-circuit between the bonding leads 3j and the first through-hole portions 3e on the main surface 3a can be prevented.

Subsequently, the assembly of the BGA 7 according to the present embodiment will be explained.

Firstly, the conductive pattern shown in FIG. 5 is formed at the device region on the main surface 3a, and the conductive pattern shown in FIG. 6 is formed at the device region on the back surface 3b. A multi-chip bonded substrate including plural device regions described above is prepared. Specifically, a multi-chip bonded substrate is prepared in which the first through-hole portions 3e extended by the extension wirings 3h from the land portions 3d and the second through-hole portions 3g (pad-on-vias) arranged on the land portions 3d are mixedly formed on each device region.

Thereafter, a die-bonding is carried out to fix the semiconductor chip 1 on the multi-chip bonded substrate via an adhesive 2.

Then, a wire bonding is carried out. Here, as shown in FIG. 2, pads 1c on the main surface 1a of the semiconductor chip 1 and the corresponding bonding leads 3j, which are wire bonding portions, of the package substrate 3 of the multi-chip bonded substrate are electrically connected via conductive wires 4 such as a gold line.

Thereafter, a resin molding is carried out. Here, the plural semiconductor chips 1 and plural wires 4 are collectively resin-encapsulated on the multi-chip bonded substrate. The resin for encapsulation is, for example, thermosetting epoxy-based resin.

Then, a ball mounting is carried out to bond the soldering balls 8 to each land portion 3d on the back surface 3b of the package substrate 3.

Then, the multi-chip bonded substrate is cut into separate pieces. For example, the multi-chip bonded substrate is cut by a dicing into each BGA 7.

According to the BGA 7 (semiconductor device) 7 in the present embodiment, the plural via portions formed on the package substrate 3 of the BGA 7 include first through-hole portions 3e extended in the plane direction by the extension wirings 3h connected to the land portions 3d and the second through-hole portions 3g that are pad-on-vias arranged on the land portions 3d (arranged at the position overlapping with the land portions 3d in a plane), whereby a high-density wiring or multi-function of the BGA 7 can be realized by using the package substrate 3 having the two-layer wiring structure.

As a result, the cost for the package substrate 3 can be reduced, compared to the case of using a multi-layer wiring board such as four-layer wiring board or six-layer wiring board, whereby the cost for the BGA 7 can be reduced.

The use of the package substrate 3 having the two-layer wiring structure makes it possible to more reduce the thickness of the board than the multi-layer wiring board, whereby the BGA 7 can be downsized (the thickness of the BGA 7 can be reduced). Since the BGA 7 has the first through-hole portions 3e extended by the extension wirings 3h in the plane direction and the second through-hole portions 3g (pad-on-vias) arranged on the land portions 3d, whereby the plural bonding leads 3j on the main surface 3a of the package substrate 3 can be arranged in about two or so rows, and hence, the wire loop can be formed in two stages, not in multi-stage. Consequently, the BGA 7 can be downsized (the thickness of the BGA 7 can be reduced).

Further, the BGA 7 has the first through-hole portions 3e extended by the extension wirings 3h in the plane direction and the second through-hole portions 3g (pad-on-vias) arranged on the land portions 3d, and the second through-hole portions 3g are arranged at the section where the wiring density is high, whereby the number of the extension wirings 3h used for the through-hoes (via portions) can be reduced.

As a result, even in the package substrate 3 having a two-layer wiring structure, the high density of the wiring and multi-function of the BGA 7 can be realized. Further, since the number of the extension wirings 3h used for the through-hoes (via portions) can be reduced, the design of the wiring layout in the package substrate 3 can be facilitated.

Further, the BGA 7 has the first through-hole portions 3e extended by the extension wirings 3h in the plane direction and the second through-hole portions 3g (pad-on-vias) arranged on the land portions 3d, and the first through-hole portions 3e are arranged at the peripheral edge portion, including the corner portions of the substrate, where stress is likely to be concentrated on the external terminals (soldering balls 8), whereby the formation of the cracks on the external terminals after the mounting of the BGA 7 to the mounting substrate can be reduced. As a result, the reliability in mounting the BGA 7 can be enhanced.

Further, the BGA 7 has the first through-hole portions 3e extended by the extension wirings 3h in the plane direction and the second through-hole portions 3g (pad-on-vias) arranged on the land portions 3d, and the first through-hole portions 3e are arranged immediately below the bonding leads 3j, whereby the bonding leads 3j and the through-holes can be shifted, since the first through-holes (via portions) 3e are extended by the extension wirings 3h.

Accordingly, the electrical short-circuit between the through-holes and the bonding leads 3j can be prevented.

The first through-hole portions 3e are arranged immediately below the bonding leads 3j, so that the through-holes of the first through-hole portions 3e are arranged as extended by the extension wirings 3h. Therefore, the direct application of the bonding load to the through-holes upon the wire bonding can be avoided. Therefore, the through-holes of the first through-hole portions 3e can withstand the bonding load upon the wire bonding.

The invention made by the inventors was specifically explained above with reference to the embodiments. The present invention is not limited to the aforesaid embodiments. Various modifications are of course possible without departing from the spirit of the present invention.

For example, the aforesaid embodiment describes the case in which the external terminals are the soldering balls 8. However, the external terminals may be the components other than the soldering balls 8. Specifically, the technique of the present invention may be applied to a semiconductor device such as LGA (Land Grid Array), so long as a semiconductor device has a wiring board having both the first through-hole portions 3e and the second through-hole portions 3g that are pad-on-vias s.

The present invention is preferable for an electronic apparatus having a wiring board.

What is claimed is:

1. A semiconductor device comprising:
    a wiring board having a first main surface, a first back surface opposite to the first main surface, a plurality of wire bonding portions formed on the first main surface, a plurality of land portions formed on the first back surface, a plurality of via portions each formed from the first main surface toward the first back surface, and a plurality of conductive portions formed in the plurality of via portions, respectively, wherein the plurality of wire bonding portions are electrically connected with the plurality of land portions through the plurality of conductive portions, respectively;
    a semiconductor chip mounted on the first main surface of the wiring board, the semiconductor chip having a second main surface, a second back surface opposite to the second main surface, and a plurality of electrode pads formed on the second main surface;
    a plurality of wires electrically connecting the plurality of electrode pads of the semiconductor chip with the wire bonding portions of the wiring board;
    a resinous member for sealing the semiconductor chip and the plurality of wires; and
    a plurality of external terminals connected to the land portions, respectively,
    wherein the plurality of via portions have a first via portion and a second via portion;
    wherein the plurality of land portions have a first land portion electrically connected with a first conductive portion formed in the first via portion, and a second land portion electrically connected with a second conductive portion formed in the second via portion;
    wherein the first via portion is arranged outside of the first land portion in a plane view;
    wherein the first conductive portion is electrically connected with the first land portion through an extension wiring formed on the first back surface of the wiring board;
    wherein the second via portion is arranged inside of the second land portion in a plane view;
    wherein a pitch (P) between the plurality of bonding portions adjacent to each other is less than a diameter (L) of each of the plurality of via portions; and
    wherein the diameter (L) is less than a diameter (M) of each of the plurality of land portions.

2. A semiconductor device according to claim 1, wherein the second via portion is arranged between the first via portions.

3. A semiconductor device according to claim 1, wherein the wire bonding portions are arranged in two rows at the peripheral edge portion and at the inside of the peripheral edge portion over the main surface of the wiring board, and the land portions are arranged in five rows at the outer peripheral portion over the back surface of the wiring board.

4. A semiconductor device according to claim 3, wherein a planar shape of the wiring board is a rectangular shape having a side;
    wherein the plurality of land portions are arranged in five rows; and
    wherein the second land portion is arranged in the second row from the side.

5. A semiconductor device according to claim 1, wherein, of the land portions, the first land portion arranged at the outermost periphery is connected to the first via portion through the extension wiring.

6. A semiconductor device according to claim 1, wherein the first via portion is arranged over the extension line of the diagonal line of the semiconductor chip over the wiring board.

7. A semiconductor device according to claim 1, wherein the wiring board has a two-layer wiring structure in which conductive patterns are formed over its main surface and its back surface.

8. A semiconductor device according to claim 1, wherein the external terminals are soldering balls.

9. A semiconductor device according to claim 1, wherein the first back surface of the wiring board is covered with an insulating film;
    wherein a part of each of the plurality of land portions is exposed from the insulating film;
    wherein the first via portion is arranged outside of the exposed part of the first land portion in a plane view; and
    wherein the second via portion is arranged inside of the exposed part of the second land portion in a plane view.

* * * * *